(12) United States Patent
Wang et al.

(10) Patent No.: US 11,708,636 B2
(45) Date of Patent: Jul. 25, 2023

(54) REACTION GAS SUPPLY SYSTEM AND CONTROL METHOD THEREOF

(71) Applicant: BEIJING NAURA MICROELECTRONICS EQUIPMENT CO., LTD., Beijing (CN)

(72) Inventors: Chun Wang, Beijing (CN); Bo Zheng, Beijing (CN); Zhenguo Ma, Beijing (CN); Jing Wang, Beijing (CN); Xin Wu, Beijing (CN); Xiaojuan Wang, Beijing (CN); Jing Shi, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 17/603,057

(22) PCT Filed: Mar. 31, 2020

(86) PCT No.: PCT/CN2020/082269
§ 371 (c)(1),
(2) Date: Oct. 12, 2021

(87) PCT Pub. No.: WO2020/211630
PCT Pub. Date: Oct. 22, 2020

(65) Prior Publication Data
US 2022/0145458 A1    May 12, 2022

(30) Foreign Application Priority Data
Apr. 16, 2019  (CN) .......................... 201910305543.7

(51) Int. Cl.
*C23C 16/40*    (2006.01)
*C23C 16/455*   (2006.01)
*C23C 16/52*    (2006.01)

(52) U.S. Cl.
CPC ............ *C23C 16/455* (2013.01); *C23C 16/52* (2013.01)

(58) Field of Classification Search
CPC ..... C23C 16/54; C23C 16/545; C23C 14/568; C23C 16/455; C23C 16/52
(Continued)

(56) References Cited

U.S. PATENT DOCUMENTS 6,413,321 B1 * 7/2002 Kim ..................... C23C 16/0209
438/758
2002/0192369 A1 * 12/2002 Morimoto ............... C23C 16/52
118/712
(Continued)

FOREIGN PATENT DOCUMENTS

CN    102251220 A    11/2011
CN    102597311 A     7/2012
(Continued)

OTHER PUBLICATIONS

The World Intellectual Property Organization (WIPO) International Search Report for PCT /CN2020/082269 dated Jun. 30, 2020 8 Pages.

*Primary Examiner* — Rudy Zervigon
(74) *Attorney, Agent, or Firm* — Anova Law Group, PLLC

(57) ABSTRACT

Embodiments of the present disclosure provide a reaction gas supply system and a control method. The reaction gas supply system includes a plurality of precursor containers and a plurality of supply regulator devices. The precursor container is connected to at least one of the reaction chambers. The plurality of precursor containers include at least a
(Continued)

pair of precursor containers of an arbitrary combination. A supply regulator device is arranged between each pair of precursor containers. The supply regulator device is configured to connect the corresponding pair of precursor containers. With the reaction gas supply system and the control method of the present disclosure, the reaction gas may be ensured to be supplied stably, the utilization rate of the precursor may be increased, and the production efficiency and the product quality may be increased.

18 Claims, 5 Drawing Sheets

(58) Field of Classification Search
USPC .......... 118/719; 156/345.22, 345.2, 345.31, 156/345.32
See application file for complete search history.

(56) References Cited

U.S. PATENT DOCUMENTS

| | | | | |
|---|---|---|---|---|
| 2003/0036272 | A1* | 2/2003 | Shamouilian | C23C 16/4405 438/691 |
| 2005/0079116 | A1* | 4/2005 | Onabe | H01L 39/2438 423/335 |
| 2005/0109374 | A1* | 5/2005 | Letessier | B08B 9/00 134/198 |
| 2007/0186849 | A1* | 8/2007 | Furuya | C23C 16/452 118/715 |
| 2008/0264337 | A1* | 10/2008 | Sano | C23C 16/4408 204/192.12 |
| 2011/0265814 | A1* | 11/2011 | Cruse | H01L 21/6719 134/1.1 |
| 2012/0160358 | A1 | 6/2012 | Yoshimoto | |
| 2013/0203267 | A1* | 8/2013 | Pomarede | H01L 21/3142 438/778 |
| 2014/0127404 | A1 | 5/2014 | Yudovsky et al. | |
| 2018/0301342 | A1 | 10/2018 | Fukazawa et al. | |
| 2019/0035698 | A1* | 1/2019 | Tanaka | H01J 37/32899 |
| 2020/0089196 | A1* | 3/2020 | Ohashi | H01L 21/67196 |

FOREIGN PATENT DOCUMENTS

| | | |
|---|---|---|
| CN | 103681412 A | 3/2014 |
| CN | 203653697 U | 6/2014 |
| CN | 106756872 A | 5/2017 |
| CN | 107400878 A | 11/2017 |
| CN | 109321895 A | 2/2019 |
| CN | 109576674 A | 4/2019 |
| CN | 110176414 A | 8/2019 |

* cited by examiner

REACTION GAS SUPPLY SYSTEM AND CONTROL METHOD THEREOF

CROSS-REFERENCE TO RELATED APPLICATIONS

This application is a national phase entry under 35 U.S.C. § 371 of International Application No. PCT/CN2020/082269, filed on Mar. 31, 2020, which claims priority to Chinese Application No. 201910305543.7 filed Apr. 16, 2019, the entire contents of both of which are incorporated herein by reference.

TECHNICAL FIELD

The present disclosure generally relates to the semiconductor manufacturing field and, more particularly, to a reaction gas supply system and a control method thereof.

BACKGROUND

Semiconductor processes include a variety of process types such as Chemical Vapor Deposition (hereinafter referred to as CVD), Physical Vapor Deposition (hereinafter referred to as PVD), wet etching (Wet Clean), and Atomic Layer Deposition (hereinafter referred to as ALD). A CVD process and an ALD process have more advantages in step coverage, etc. As such, the CVD and ALD processes are applied more and more in semiconductor process flows.

The CVD and ALD processes generally include a variety of gaseous reactions, and the processes consume large amounts of reaction gases. Therefore, high-purity gases and non-gaseous precursors need to be supplied. For non-gaseous precursors, the precursors need to be heated to volatilize into gaseous reactants. Then, the gaseous reactants are guided into a reaction chamber for reaction. A flow of a reaction gas is controlled through a flow meter. However, if the gaseous precursor cannot be supplied sufficiently and steadily during the reaction stage, the process result will be affected.

Thus, in an existing method, the precursor volatilization rate is increased by increasing the heating temperature of a precursor container. However, the heating temperature cannot be higher than the decomposition temperature of the precursor, which limits the increase in the volatilization rate of the precursor. Improvement of gas supply ability is limited. Moreover, to increase the heating temperature, heating components and heat-resistant components with higher specifications need to be adaptively equipped, which increases equipment costs.

In another existing method, the volume of the gaseous precursor stored in the precursor container is increased by reducing the volume occupied by the precursor in the precursor container. Thus, the reaction gas supply ability is enhanced. However, a supplement and replacement frequency of the precursor will be increased at the same time, which reduces equipment production capacity. Although the volume and number of precursor containers can be increased to increase the reaction gas supply ability, such increase will increase the clean room area occupied by the equipment (reduced throughput) and increase the equipment costs. Therefore, a technical solution is needed urgently to resolve the lack of reaction gas supply ability.

SUMMARY

According to this, embodiments of the present disclosure provide a reaction gas supply system and a control method, which ensures that the reaction gas is supplied stably, increases the utilization rate of the precursor, and improves the production efficiency and product quality.

According to an aspect of embodiments of the present disclosure, a reaction gas supply system is provided. The system is configured to supply reaction gas to a plurality of reaction chambers. The system includes a plurality of precursor containers and a plurality of supply regulator devices. The precursor containers are connected to at least one of the reaction chambers. The plurality of precursor containers include at least a pair of precursor containers with an arbitrary combination. One of the plurality of supply regulator devices is arranged between each pair of precursor containers. The supply regulator device is configured to connect a corresponding pair of precursor containers.

Optionally, the supply regulator device includes pipeline units and pipeline control units. A number of the pipeline units and a number of the pipeline control units are same. A pipeline control unit is configured to control on/off of a corresponding pipeline unit. The pipeline unit is connected between a corresponding pair of precursor containers for transferring the reaction gas.

Optionally, the pipeline unit includes a first pipeline. Two ends of the first pipeline are connected to the corresponding pair of precursor containers, respectively. The pipeline control unit includes a first valve device. The first valve device is arranged in the corresponding first pipeline for controlling on/off of the first pipeline.

Optionally, the first valve device includes a vacuum valve.

Optionally, the pipeline unit includes a second pipeline and a third pipeline. Two ends of the second pipeline and two ends of the third pipeline are connected to the corresponding pair of precursor containers. The pipeline control unit includes a second valve device and a third valve device. The second valve device and the third valve device are arranged in the second pipeline and the third pipeline, respectively, are configured to control on/off of the second pipeline and the third pipeline, and cause pipelines where they are located to be a one direction passage. An on direction of the second pipeline controlled by the second valve device is opposite to an on direction of the third pipeline controlled by the third valve device.

Optionally, the second valve device and the third valve device both include a vacuum valve and a one-way valve.

Optionally, the precursor container includes a container for storing a non-gaseous precursor and a gas transfer pipeline connected to the container and at least one of the reaction chambers. The gas transfer pipeline is configured to transfer the reaction gas generated by the non-gaseous precursor stored in the container through volatilization to at least one of the reaction chambers.

Optionally, the pipeline unit is connected between the gas transfer pipeline of the corresponding pair of precursor containers and configured to transfer the reaction gas between the gas transfer pipelines of the corresponding pair of precursor containers.

Optionally, the precursor container further includes a flow control device. The flow control device is arranged in the gas transfer pipeline and configured to control a flow of the reaction gas transferred to the reaction chamber.

Optionally, in a gas transfer direction of the gas transfer pipeline, a connection point of the pipeline unit and the gas transfer pipeline is located upstream of the flow control device.

Optionally, a number of the precursor containers and a number of the reaction chambers are same. The precursor containers and the reaction chambers are arranged in a one-to-one correspondence. Each of the precursor containers is grouped with a precursor container of the other remaining precursor containers to form a pair of precursor containers. The supply regulator device is arranged between each pair of precursor containers.

As another technical solution, the present disclosure further provides a control method of the reaction gas supply system. The method includes determining whether a flow of a reaction gas supplied to a reaction chamber in a process stage is lower than a preset flow threshold and if yes, controlling a supply regulator device to connect a precursor container connected to the reaction chamber in the process stage to a precursor container connected to a reaction chamber in an idle or non-process stage.

The present disclosure includes the following beneficial effects.

In the technical solutions of the reaction gas supply system and the control method thereof provided by the present disclosure, with the aid of the supply regulator device connected between the at least a pair of precursor containers that are arbitrarily grouped, the pair of precursor containers are connected. The reaction gas may be transferred between the precursor containers. Thus, when the flow of the gas provided to the reaction chambers that are in the process stage is insufficient, the at least one of the precursor containers connected to the reaction chamber that is in the idle or non-process stage may be used to transfer the reaction gas to the to-be-supplemented precursor containers. Thus, the flow of the reaction gas provided by the precursor container to the connected reaction chamber may be ensured to be sufficient. The reaction gas may be ensured to be supplied stably. The utilization rate of the precursor may be increased. The production efficiency and the product quality may be improved.

The additional aspects and advantages of embodiments of the present disclosure are partially described below. The additional aspects and advantages will become obvious from the following description, or be understood through the practice of the present disclosure.

BRIEF DESCRIPTION OF THE DRAWINGS

To make embodiments of the present disclosure or the technical solutions in the prior art clearer, the accompanying drawings required by embodiments or description of the prior art are briefly introduced. Obviously, the described drawings are only some embodiments of the present disclosure. For those of ordinary skills in the art, without any creative work, all other drawings may be obtained based on these accompanying drawings.

DETAILED DESCRIPTION OF THE EMBODIMENTS

The present disclosure is described more fully with reference to the accompanying drawings. Exemplary embodiments of the present disclosure are described. The technical solutions of embodiments of the present disclosure are described clearly and entirely in connection with the accompanying drawings. Obviously, described embodiments are only some embodiments of the present disclosure, not all embodiments. Based on embodiments of the present disclosure, all other embodiments obtained by those of ordinary skill in the art without creative effort are within the scope of the present disclosure. The technical solutions of the present disclosure are described in various aspects with reference to the drawings and embodiments.

To facilitate the description of embodiments, the terms "left," "right," "up," and "down" referred to below are consistent with left, right, up, and down directions of the accompanying drawings. The following "first," "second," etc., are only used to describe the difference, and do not have another special meaning.

Figure 1:
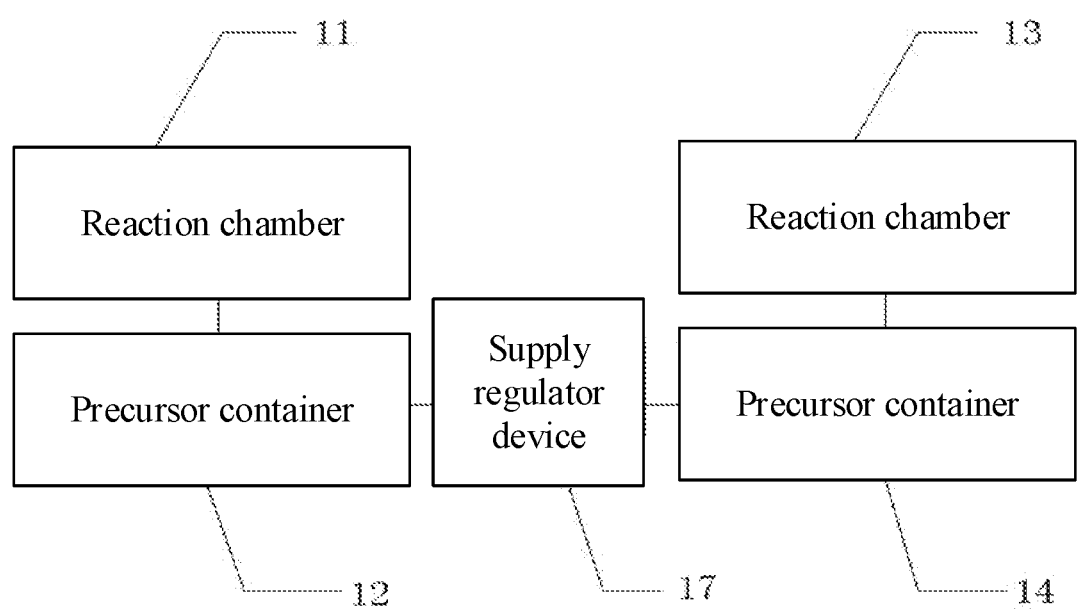
FIG. 1 is a schematic block diagram showing a principle of a reaction gas supply system according to a first embodiment of the present disclosure.

As shown in FIG. 1, a first embodiment of the present disclosure provides a reaction gas supply system. The reaction gas supply system may be configured to provide a reaction gas to two reaction chambers (11, 13). The system includes two precursor containers (12, 14) and a supply regulator device 17. The two precursor containers (12, 14) may be connected to the two reaction chambers (11, 13), respectively. The two precursor containers (12, 14) may be configured to provide the reaction gas to the two reaction chambers (11, 13). The two reaction chambers (11, 13) and the two precursor containers (12, 14) may include a plurality of structures. The reaction gas may include a plurality of existing gases.

The supply regulator device 17 may include a plurality of structures. The supply regulator device 17 may be connected between the two precursor containers (12, 14) and configured to connect the two precursor containers. As such, gas transfer between the two precursor containers (12, 14) may be realized. One of the precursor containers may supply the reaction gas to the other precursor container through the supply regulator device 17 to realize the supplement of the reaction gas.

During the process, if the reaction chamber 11 is in a process stage, the reaction chamber 13 is in an idle or non-process stage, while the precursor container 12 supplies the reaction gas to the reaction chamber 11, the precursor container 14 may transfer the reaction gas into the precursor container 12 through the supply regulator device 17. Thus, the reaction gas supply ability may be improved. Similarly, if the reaction chamber 13 is in the process stage, the reaction chamber 11 is in the idle or non-process stage, while the precursor container 14 supplies the reaction gas to the reaction chamber 13, the precursor container 12 may transfer the reaction gas into the precursor container 14 through the supply regulator device 17.

In the reaction gas supply system of embodiments of the present disclosure, when a flow of a gas supplied to the reaction chamber, which is in the process stage, is insufficient, the precursor container connected to the reaction chamber, which in the idle or non-process stage, may be used to supply the reaction gas to the to-be-supplemented precursor container to ensure that the flow of the reaction gas supplied by the precursor container to the connected reaction chamber is sufficient. Thus, the reaction gas may be ensured to be supplied stably. A utilization rate of a precursor may be increased. Production efficiency and product quality may be increased.

Figure 2:
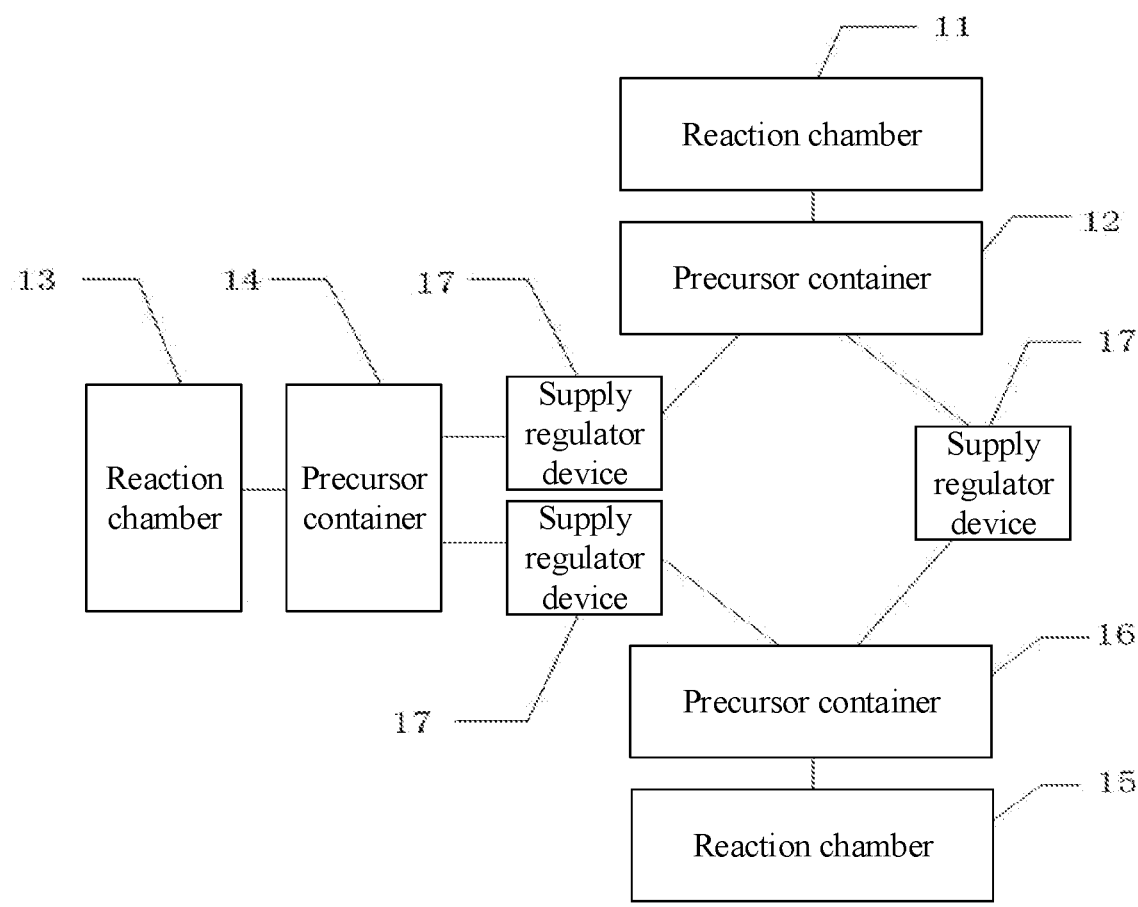
FIG. 2 is a schematic block diagram showing a principle of a reaction gas supply system according to a second embodiment of the present disclosure.

As shown in FIG. 2, in a reaction gas supply system provided by a second embodiment of the present disclosure, compared with the above-mentioned first embodiment, differences of the two embodiments include that the reaction gas supply system includes three precursor containers (12, 14, 16) and supply regulator devices 17. The three precursor containers (12, 14, 16) are connected to three reaction chambers (11, 13, 15) in a one-to-one correspondence. In the three precursor containers (12, 14, 16), each two of the precursor containers may be grouped into three pairs of precursor containers. The supply regulator device 17 is arranged between precursor containers of each pair. Specifically, the supply regulator devices 17 are arranged between the two precursor containers (12, 14), between the two precursor containers (12, 16), and between the two precursor containers (14, 16). As such, the two precursor containers (12, 14) communicate with each other, the two precursor containers (12, 16) communicate with each other, and the two precursor containers (14, 16) communicate with each other through the supply regulator devices 17.

Therefore, when any one of the three reaction chambers (11, 13, 15) is in the process stage, if at least one of the remaining two reaction chambers is in the idle or non-process stage, the precursor container connected to the reaction container may provide additional reaction gas to the precursor container connected to the reaction chamber, which is in the process stage, through the corresponding supply regulator device 17. Thus, the flow of the reaction gas provided by the precursor container to the connected reaction chamber may be ensured to be sufficient. Thus, a stable supply of the reaction gas may be ensured. The utilization rate of the precursor may be increased. The production efficiency and product quality may be increased.

In practical applications, according to the specific need, at least one pair of precursor containers may be arbitrarily grouped, and the supply regulator device 17 may be arranged between the precursor containers of each pair.

It should be noted that, in some embodiments, the number of the precursor containers and the reaction chambers may be same. The precursor containers and the reaction chambers are arranged in a one-to-one correspondence. However, the present disclosure is not limited to this. In practical applications, a same precursor container may be connected to a reaction chamber or a plurality of reaction chambers. Moreover, different precursor containers may be connected to a same reaction chamber or different reaction chambers.

Figure 3:
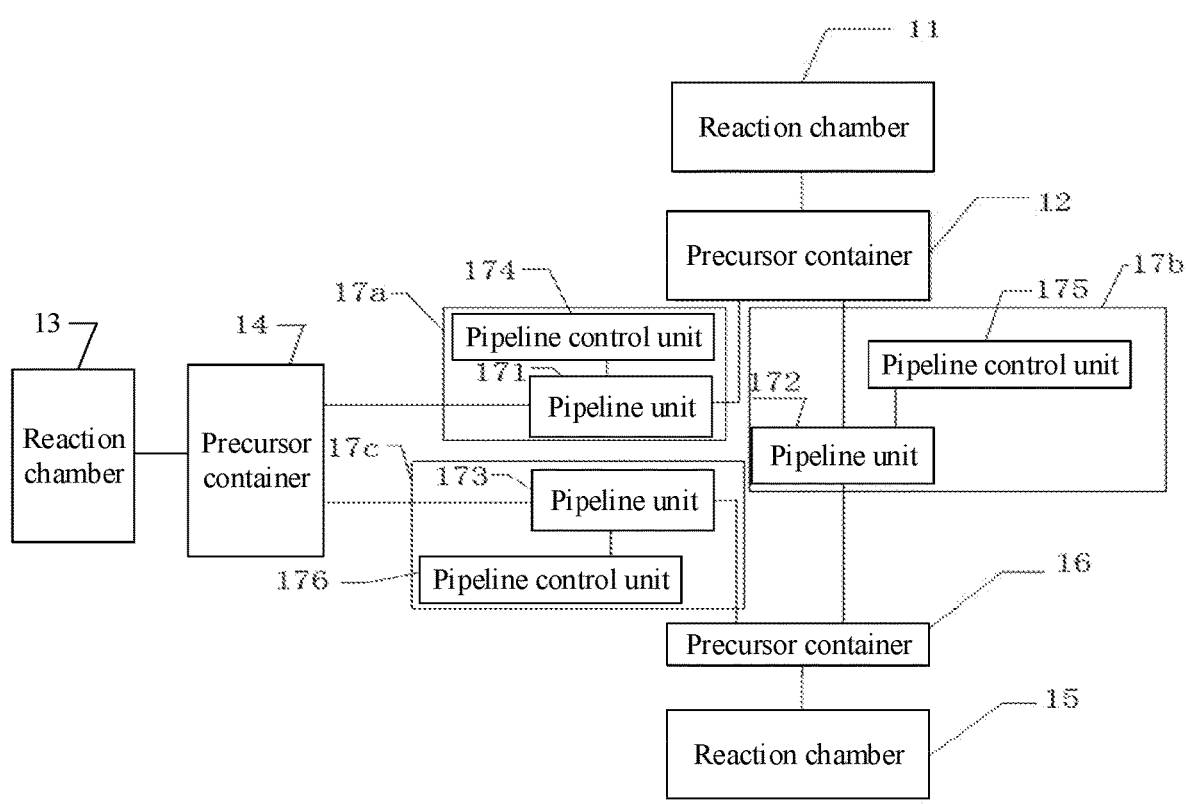
FIG. 3 is a schematic block diagram showing a principle of a reaction gas supply system according to a third embodiment of the present disclosure.

As shown in FIG. 3, a third embodiment of the present disclosure provides a reaction gas supply system. The reaction gas supply system is based on the above-mentioned second embodiment, which provides a specific implementation of the supply regulator device 17.

Specifically, three regulator devices 17 are included. The three regulator devices 17 include a supply regulator device 17a, a supply regulator device 17b, and a supply regulator device 17c, respectively. The supply regulator device 17a includes a pipeline unit 171 and a pipeline control unit 174. The pipeline unit 171 is connected between the two precursor containers (12, 14). The pipeline unit 171 may be configured to transfer gas between the two precursor containers (12, 14). The pipeline control unit 174 may be configured to control on/off of the pipeline unit 171. The supply regulator 17b includes a pipeline unit 172 and a pipeline control unit 175. The pipeline unit 172 is connected between the two precursor containers (12, 16). The pipeline unit 172 may be configured to transfer gas between the two precursor containers (12, 16). The pipeline control unit 175 may be configured to control on/off of the pipeline unit 172. The supply regulator 17c includes a pipeline unit 173 and a pipeline control unit 176. The pipeline unit 173 is connected between the two precursor containers (14, 16). The pipeline unit 173 may be configured to transfer gas between the two precursor containers (14, 16). The pipeline control unit 176 may be configured to control on/off of the pipeline unit 173.

Of course, in practical applications, the number of the pipeline units and the connection to the precursor containers may also include a plurality of other configurations. Further, the number of pipeline control units and the number of pipeline units are the same. The pipeline control units and the pipeline units are arranged in a one-to-one correspondence.

The structure of the reaction gas supply system is described in detail below by taking the supply system for supplying the reaction gas to the two reaction chambers of the above first embodiment as an example.

Figure 4:
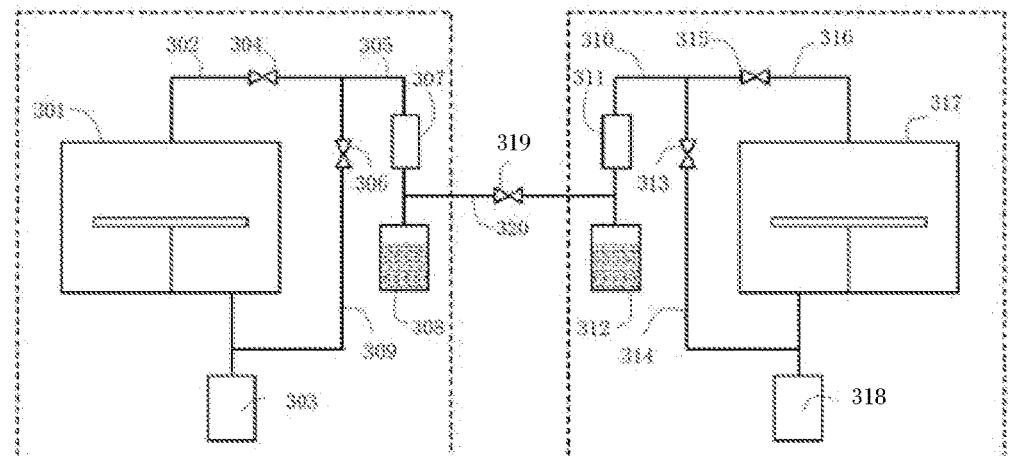
FIG. 4 is a schematic structural diagram of a reaction gas supply system according to the first embodiment of the present disclosure.

Specifically, as shown in FIG. 4, the system includes two precursor containers (308, 312) and a supply regulator device. The two precursor containers (308, 312) are connected to two reaction chambers (301, 317), respectively. The two precursor containers (308, 312) may be configured to provide the reaction gas to the two reaction chambers (301, 317). Moreover, the precursor container 308 includes a container for storing a non-gaseous precursor and a gas transfer pipeline connected to the container and the reaction chamber 301. The non-gaseous precursor in the container may generate the reaction gas through volatilization. The reaction gas may be transferred into the reaction chamber 301 through the gas transfer pipeline.

In some embodiments, the gas transfer pipeline connected to the reaction chamber 301 includes three pipelines (302, 305, 309). A gas inlet end of the pipeline 305 is connected to the precursor container 308, and a gas outlet end of the pipeline 305 is connected to the gas inlet end of the pipeline 302 and the gas inlet end of the pipeline 309. A gas outlet end of the pipeline 302 is connected to the reaction chamber 301. A gas outlet of the pipeline 309 is connected to a vacuum pump 303. Moreover, two vacuum valves (304, 306) are arranged at the pipeline 302 and the pipeline 309, respectively. The two vacuum valves (304, 306) may be configured to control the on/off of the pipeline.

The gas transfer pipeline connected to the reaction chamber 317 includes three gas transfer pipelines (310, 316, 314). A gas inlet end of the pipeline 310 is connected to the precursor container 312. A gas outlet end of the pipeline 310 is connected to the gas inlet end of the pipeline 316 and the gas inlet end of the pipeline 314. A gas outlet end of the pipeline 316 is connected to the reaction chamber 317. A gas outlet of the pipeline 314 is connected to a vacuum pump 318. Moreover, two vacuum valves (315, 313) are arranged at the pipeline 316 and the pipeline 314, respectively. The two vacuum valves (315, 313) may be configured to control the on/off of the pipeline.

In some embodiments, for the precursor container 308, a flow control device 307 is further arranged in the pipeline 305. The flow control device may be configured to control the flow of the reaction gas transferred into the reaction chamber 301. For the precursor container 312, a flow control device 311 is further arranged in the pipeline 310. The flow control device may be configured to control the flow of the reaction gas transferred into the reaction chamber 317. The flow control device may include a flow meter, etc.

The gas transfer manner of the precursor container is described in detail by taking the precursor container 308 as an example. Specifically, the precursor container 308 is arranged near the reaction chamber 301. The non-gaseous precursor in the precursor container 308 may be heated. The non-gaseous precursor may volatilize to produce a gaseous reactant. The gaseous reactant is stored above the non-gaseous precursor of the precursor container 308. Before the process steps begin, the vacuum valve 304 may be off, and the vacuum valve 306 may be on. Thus, the reaction gas may enter the vacuum pump 303 through the pipeline 305 and the pipeline 309 in sequence. At this time, the reaction gas may not enter the reaction chamber 301. When the process begins, the vacuum valve 304 is on, and the vacuum valve 306 is off. Thus, the reaction gas may enter the reaction chamber 301 through the pipeline 305 and the pipeline 302 in sequence. Meanwhile, the flow of the reaction gas transferred into the reaction chamber 301 may be controlled by the flow control device 307. The gas delivery manner of the precursor container 312 may be the same as the above-mentioned manner, which is not repeated here.

In some embodiments, the pipeline unit of the supply regulator device includes a first pipeline 320. The first pipeline 320 is connected between the two precursor containers (308, 312). Specifically, two ends of the first pipeline 320 are connected to two pipelines (305, 310) corresponding to the two precursor containers (308, 312), respectively. The pipeline control unit includes a first valve device 319. The first valve device 319 is arranged in the first pipeline 320. The first valve device 319 may be configured to control on/off of the first pipeline 320. The first valve device 319 includes a vacuum valve, etc.

In some embodiments, in a gas transfer direction of the gas transfer pipeline, connection points of the first pipeline 320 and the two pipelines (305, 310) may be located at upstream locations of the two flow control devices (307, 311). As such, the flow control devices (307, 311) may adjust the flow of the mixed gas of the reaction gas output by the first pipeline 320 and the reaction gas output by the precursor container, that is, the flow of the gas flowing into the reaction chamber.

When the reaction chamber 301 is in a process stage, the vacuum valve 304 may be on, and the vacuum valve 306 may be off. The gaseous precursor of the precursor container 308 may enter the reaction chamber 301 through the pipeline 305 and the pipeline 302 in sequence. When the reaction chamber 317 is in the idle or non-process stage, the vacuum valve 313 and the vacuum valve 315 may be off. As the process progresses, if a situation that the supply of the gaseous precursor of the precursor container 308 is insufficient occurs, the first valve device 319 may be switched on. The gaseous precursor in the precursor container 312 may be supplied to the reaction chamber 301 through the first pipeline 320, the pipeline 305, and the pipeline 302 in sequence. During this process, the flow control device 307 controls the flow of the reaction gas to ensure the flow of the reaction gas to be stable.

When the reaction chamber 317 is in the process stage, the vacuum valve 315 may be on, and the vacuum valve 313 may be off. The gaseous precursor of the precursor container 312 may enter the reaction chamber 317 through the pipeline 310 and the pipeline 315 in sequence. When the reaction chamber 301 is in the idle or non-process stage, the vacuum valve 304 and the vacuum valve 306 may be off. As the process progresses, if a situation that the supply of gaseous precursors in the precursor container 312 is insufficient occurs, the first valve device 319 may be switched on. The gaseous precursor in the precursor container 308 may be supplied to the reaction chamber 317 through the first pipeline 320, the pipeline 310, and the pipeline 315 in sequence. During the process, the flow control device 311 may control the flow of the reaction gas to ensure the flow of the reaction gas to be stable.

It should be noted that, in some embodiments, the pipeline unit of the supply regulator device includes the first pipeline 320. But the present disclosure is not limited to this. In practical applications, the pipeline unit and the pipeline control unit may further include other structures.

Figure 5:
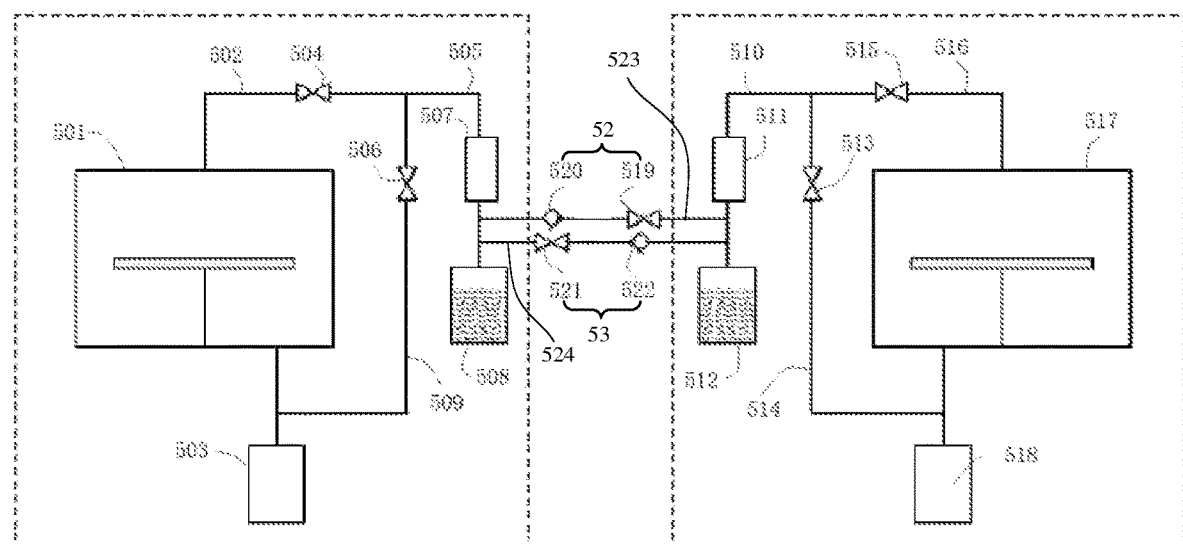
FIG. 5 is a schematic structural diagram of another reaction gas supply system according to the first embodiment of the present disclosure.

For example, as shown in FIG. 5, the pipeline unit of the supply regulator device includes a second pipeline 523 and a third pipeline 524. Two ends of the second pipeline 523 and two ends of the third pipeline 524 are both connected between the gas transfer pipelines of the two precursor containers (508, 512). Specifically, the two ends of the second pipeline 523 and the two ends of the third pipeline 524 are both connected to the two pipelines (505, 510) corresponding to the two precursor containers (508, 512), respectively.

The pipeline control unit includes a second valve device and a third valve device, which are arranged in the second pipeline 523 and the third pipeline 524, respectively. The second valve device and the third valve device may be configured to control on/off of the second pipeline 523 and the third pipeline 524, respectively, and may cause the pipelines where they are located to be a one direction passage. An on direction of the second pipeline 523 controlled by the second valve device may be opposite to an on direction of the third pipeline 524 controlled by the third valve device. As such, a situation of an occurrence of gas backflow in the second pipeline 523 or the third pipeline 524 may be avoided.

In some embodiments, the second valve device 52 arranged in the second pipeline 523 includes a vacuum valve 519 and a one-way valve 520. The third valve device 53 arranged in the third pipeline 524 includes a vacuum valve 521 and a one-way valve 522.

When the reaction chamber 501 is in the process stage, the vacuum valve 504 may be on, and the vacuum valve 506 may be off. The gaseous precursor of the precursor container 308 may enter the reaction chamber 501 through the pipeline 505 and the pipeline 502 in sequence. When the reaction chamber 517 is in the idle or non-process stage, the vacuum valve 513 and the vacuum valve 515 may be off. As the process progresses, if a situation that the supply of gaseous precursors in the precursor container 508 is insufficient occurs, the vacuum valve 519 arranged in the second valve device may be switched on. A gas pressure of the precursor container 512 may be higher than a gas pressure of the precursor container 508, which causes the one-way valve 520 to be on. The gaseous precursor of the precursor container 512 may be supplied to the reaction chamber 501 through the second pipeline 523, the pipeline 505, and the pipeline 502 in sequence. During this process, the flow control device 507 may control the flow of the reaction gas to ensure the flow of the reaction gas to be stable.

When the reaction chamber 517 is in the process stage, the vacuum valve 515 may be on, and the vacuum valve 513 may be off. The gaseous precursor of the precursor container 512 may enter the reaction chamber 517 through the pipeline 510 and the pipeline 516 in sequence. When the reaction chamber 501 is in the idle or non-process stage, the vacuum valve 504 and the vacuum valve 506 may be off. As the process progresses, if a situation that the supply of gaseous precursors in the precursor container 517 is insufficient occurs, the vacuum valve 521 arranged in the third valve device may be switched on. The gas pressure of the precursor container 508 may be higher than the gas pressure of the precursor container 512. The one-way valve 522 may be on. The gaseous precursor of the precursor container 508 may be supplied to the reaction chamber 517 through the second pipeline 524, the pipeline 510, and the pipeline 516 in sequence. During this process, the flow control device 511 may control the flow of the reaction gas to ensure the flow of the reaction gas to be stable.

In summary, embodiments of the present disclosure provide the reaction gas supply system. With the aid of the supply regulator device connected between at least one pair of the precursor containers in any combination, the pair of the precursor containers may be connected. The gas transfer between the precursor containers may be realized. As such, when the situation that the flow of the gas supplied to the reaction chamber in the process stage is insufficient occurs, at least one precursor container connected to the reaction chamber in the idle or non-process may be used to supply the reaction gas to the reaction chamber in the process stage. The flow of the reaction gas provided by the precursor container to the connected reaction chamber may be ensured to be sufficient. The reaction gas may be ensured to be stably supplied. The utilization rate of the precursor may be increased. The production efficiency and product quality may be increased.

Figure 6:
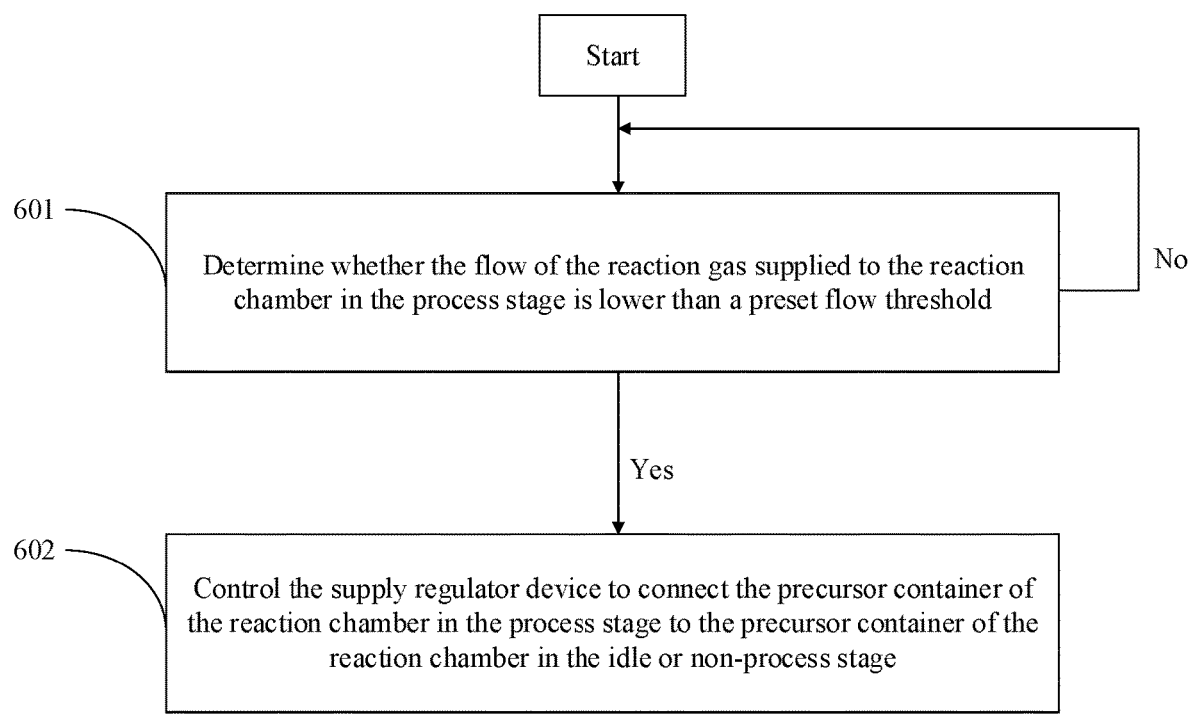
FIG. 6 is a schematic flowchart of a control method of a reaction gas supply system according to a fourth embodiment of the present disclosure.

As another technical solution, as shown in FIG. 6, a fourth embodiment of the present disclosure provides a control method of a reaction gas supply system.

The method includes:

At 601, determining whether the flow of the reaction gas supplied to the reaction chamber in the process stage is lower than a preset flow threshold, if yes, then proceed to step 602, if no, then return to step 601; and At 602, controlling the supply regulator device to connect the precursor container of the reaction chamber in the process stage to the precursor container of the reaction chamber in the idle or non-process stage.

Embodiments of the present disclosure provide the control method of the reaction gas supply system. When a situation that the flow of the gas provided to the reaction chambers in the process stage is insufficient occurs, at least one of the precursor containers connected to a reaction chamber in the idle or non-process stage may be used to transfer the reaction gas to the to-be-supplemented precursor container. The flow of the reaction gas provided by the precursor container to the connected reaction chamber may be ensured to be sufficient. The supply of the reaction gas may be ensured to be stable. The utilization rate of the precursor may be increased. The production efficiency and product quality may be increased.

Unless otherwise stated in any technical solution disclosed in the present disclosure, if the disclosure discloses a numerical range, the disclosed numerical range may be a preferred numerical range. Those skilled in the art should understand that the preferred numerical range may only include numerical values with obvious technical effect or representative among the many feasible numerical values. Due to a large number of values, the values may not be exhaustively listed. Therefore, the present disclosure only discloses some numerical values to illustrate the technical solutions of the present disclosure. Moreover, the above-listed numerical values should not limit the scope of the present disclosure.

At the same time, if the above-mentioned present disclosure discloses or involves parts or structural parts that are fixedly connected to each other, then, unless otherwise stated, a fixed connection may be understood as a fixed connection that may be detached (for example, connection with bolts or screws), or it may be understood as a non-detachable fixed connection (e.g., riveting, welding). Of course, the mutual fixed connection may also be replaced by an integral structure (e.g., using a casting process to form one piece) (except when it is obviously impossible to use the integral forming process)

In addition, unless otherwise stated, the meanings of the terms used in any of the technical solutions disclosed in the present disclosure for indicating a positional relationship or shape include a state or a shape same as, similar to, or close to the meanings. Any component provided by the present disclosure may be assembled by a plurality of individual components or may be a single component manufactured in an integral forming process.

The above embodiments are only used to illustrate the technical solutions of the present disclosure but not to limit it. Although the present disclosure has been described in detail with reference to preferred embodiments, those of ordinary skill in the art should understand that modifications and equivalent replacements may still be performed on specific embodiments of the present disclosure. Without departing from the spirit of the technical solution of the present disclosure, the modifications and the equivalent replacements are within in the scope of the technical solution of the present disclosure.

The description of the present disclosure is given for the example and description, and is not exhaustive or does not limit the present disclosure to the disclosed form. Many modifications and changes are obvious to those of ordinary skill in the art. Embodiments are selected and described to better illustrate the principles and practical applications of the present disclosure. Moreover, those of ordinary skill in the art may understand the present disclosure to design various embodiments with various modifications, which are suitable for specific purposes.

What is claimed is:

1. A reaction gas supply system configured to supply reaction gas to a plurality of reaction chambers, comprising:
   a plurality of precursor containers, including:
      a first precursor container of the plurality of precursor containers connected to a first reaction chamber of the plurality of reaction chambers;
      in addition to the first precursor container and the first reaction chamber, a second precursor container of the plurality of precursor container connected to a second reaction chamber of the plurality of reaction chambers; and
      in addition to the first precursor container, the first reaction chamber, the second precursor container, and the second chamber, a third precursor container of the plurality of precursor container connected to a third reaction chamber of the plurality of reaction chambers; and
   a plurality of supply regulator devices, including:
      a first supply regulator device arranged between the first precursor container and the second precursor container, the first supply regulator device being configured to connect the first precursor container and the second precursor container, to enable the first precursor container to supply a precursor to the second chamber in response to the second precursor container being unable to supply the precursor sufficiently to the second chamber;

a second supply regulator device arranged between the first precursor container and the third precursor container, the second supply regulator device being configured to connect the first precursor container and the third precursor container, to enable the third precursor container to supply the precursor to the first chamber in response to the first precursor container being unable to supply the precursor sufficiently to the first chamber; and a third supply regulator device arranged between the second precursor container and the third precursor container, and the third supply regulator device being configured to connect the second precursor container and the third precursor container, to enable the second precursor container to supply the precursor to the third chamber in response to the third precursor container being unable to supply the precursor sufficiently to the third chamber.

2. The system according to claim 1, wherein:
the first supply regulator device includes pipeline units and pipeline control units, a number of the pipeline units being equal to a number of the pipeline control units, a pipeline control unit being configured to control on/off of a corresponding pipeline unit, and a pipeline unit being connected between the first precursor container and the second precursor container for transferring the reaction gas.

3. The system according to claim 2, wherein:
the pipeline unit includes a first pipeline, two ends of the first pipeline being connected to the first precursor container and the second precursor container, respectively; and
the pipeline control unit includes a first valve device, the first valve device being arranged in the first pipeline for controlling on/off of the first pipeline.

4. The system according to claim 2, wherein:
the pipeline unit includes a second pipeline and a third pipeline, two ends of the second pipeline and two ends of the third pipeline being connected to the first precursor container and the second precursor container; and
the pipeline control unit includes a second valve device and a third valve device, the second valve device and the third valve device being arranged in the second pipeline and the third pipeline, respectively, being configured to control on/off of the second pipeline and the third pipeline, and causing the second pipeline and the third pipeline to be have a one direction passage, and an on direction of the second pipeline controlled by the second valve device being opposite to an on direction of the third pipeline controlled by the third valve device.

5. The system according to claim 4, wherein each of the second valve device and the third valve device includes a vacuum valve and a one-way valve.

6. The system according to claim 2, wherein:
the first precursor container includes a container for storing a non-gaseous precursor and a gas transfer pipeline connecting the container and the first reaction chamber, the gas transfer pipeline being configured to transfer the reaction gas generated by the non-gaseous precursor stored in the container through volatilization to the first reaction chamber.

7. The system according to claim 6, wherein:
the pipeline unit is connected between gas transfer pipelines of the first precursor container and the second precursor container and configured to transfer the reaction gas between the gas transfer pipelines of the first precursor container and the second precursor container.

8. The system according to claim 7, further comprising:
a plurality of flow control devices, each of the plurality of flow control devices being connected to a corresponding precursor container and being arranged in the gas transfer pipeline and configured to control a flow of the reaction gas transferred to the reaction chamber.

9. The system according to claim 8, wherein:
in a gas transfer direction of the gas transfer pipeline, a connection point of the pipeline unit and the gas transfer pipeline is located upstream of the flow control device.

10. The system according to claim 1, wherein:
a number of the plurality of precursor containers is equal to a number of the plurality of reaction chambers;
the plurality of precursor containers and the plurality of reaction chambers are arranged in a one-to-one correspondence.

11. A control method for controlling a reaction gas supply system configured to supply reaction gas to a plurality of reaction chambers, comprising:
determining that a flow of reaction gas supplied to a first reaction chamber in a process stage is lower than a preset flow threshold; and
controlling a supply regulator device to connect a first precursor container connected to the first reaction chamber in the process stage to a second precursor container connected to a second reaction chamber in an idle or non-process stage;
wherein the reaction gas supply system includes:
a plurality of precursor containers, including:
the first precursor container of the plurality of precursor containers connected to the first reaction chamber of the plurality of reaction chambers;
in addition to the first precursor container and the first reaction chamber, the second precursor container of the plurality of precursor container connected to the second reaction chamber of the plurality of reaction chambers; and
in addition to the first precursor container, the first reaction chamber, the second precursor container, and the second chamber, a third precursor container of the plurality of precursor container connected to a third reaction chamber of the plurality of reaction chambers; and
a plurality of supply regulator devices, including:
a first supply regulator device arranged between the first precursor container and the second precursor container, the first supply regulator device being configured to connect the first precursor container and the second precursor container, to enable the first precursor container to supply a precursor to the second chamber in response to the second precursor container being unable to supply the precursor sufficiently to the second chamber;
a second supply regulator device arranged between the first precursor container and the third precursor container, the second supply regulator device being configured to connect the first precursor container and the third precursor container, to enable the third precursor container to supply the precursor to the first chamber in response to the first precursor container being unable to supply the precursor sufficiently to the first chamber; and a third supply regulator device arranged between the second precursor container and the third precursor container, and the third supply regulator device being configured to connect the second precursor container and the third precursor container, to enable the second precursor container to supply the precursor to the third chamber in response to the third precursor container being unable to supply the precursor sufficiently to the third chamber.

12. The control method according to claim 11, wherein the first supply regulator device includes:

pipeline units and pipeline control units, a number of the pipeline units being equal to a number of the pipeline control units, a pipeline control unit being configured to control on/off of a corresponding pipeline unit, and a pipeline unit being connected between the first precursor container and the second precursor container for transferring the reaction gas.

13. The control method according to claim 12, wherein:

the pipeline unit includes a first pipeline, two ends of the first pipeline being connected to the first precursor container and the second precursor container, respectively; and the pipeline control unit includes a first valve device, the first valve device being arranged in the first pipeline for controlling on/off of the first pipeline.

14. The control method according to claim 12, wherein:

the pipeline unit includes a second pipeline and a third pipeline, two ends of the second pipeline and two ends of the third pipeline being connected to the first precursor container and the second precursor container; and the pipeline control unit includes a second valve device and a third valve device, the second valve device and the third valve device being arranged in the second pipeline and the third pipeline, respectively, being configured to control on/off of the second pipeline and the third pipeline, and causing the second pipeline and the third pipeline to be have a one direction passage, and an on direction of the second pipeline controlled by the second valve device being opposite to an on direction of the third pipeline controlled by the third valve device.

15. The control method according to claim 14, wherein each of the second valve device and the third valve device including a vacuum valve and a one-way valve.

16. The control method of claim 12, wherein:

the first precursor container includes a container for storing a non-gaseous precursor and a gas transfer pipeline connecting the container and the first reaction chamber, the gas transfer pipeline being configured to transfer the reaction gas generated by the non-gaseous precursor stored in the container through volatilization to the first reaction chamber.

17. The control method of claim 16, wherein:

the pipeline unit is connected between gas transfer pipelines of the first precursor container and the second precursor container and configured to transfer the reaction gas between the gas transfer pipelines of the first precursor container and the second precursor container.

18. The control method to claim 17, wherein:

the reaction gas supply system further includes a plurality of flow control devices, each of the plurality of flow control devices being connected to a corresponding precursor container and being arranged in the gas transfer pipeline and configured to control a flow of the reaction gas transferred to the reaction chamber.

* * * * *